United States Patent
Chai

(10) Patent No.: US 10,206,291 B2
(45) Date of Patent: Feb. 12, 2019

(54) MANUFACTURING METHOD FOR SUBSTRATE OF FLAT PANEL DISPLAY DEVICE

(71) Applicant: Shenzhen China Star Optoelectronics Technology Co., Ltd., Shenzhen, Guangdong (CN)

(72) Inventor: Li Chai, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 633 days.

(21) Appl. No.: 14/918,623

(22) Filed: Oct. 21, 2015

(65) Prior Publication Data

US 2016/0057871 A1 Feb. 25, 2016

Related U.S. Application Data

(62) Division of application No. 13/985,285, filed on Aug. 13, 2013, now Pat. No. 9,210,797.

(51) Int. Cl.
*H05K 3/46* (2006.01)
*G02F 1/1345* (2006.01)
(Continued)

(52) U.S. Cl.
CPC ......... *H05K 3/4644* (2013.01); *G02F 1/1345* (2013.01); *H01L 27/124* (2013.01);
(Continued)

(58) Field of Classification Search
CPC .. H05K 3/4644; H05K 1/0213; H05K 1/0265; H01L 23/4951; G02F 1/1345; G02F 1/13452; G02F 2201/12
See application file for complete search history.

(56) References Cited

U.S. PATENT DOCUMENTS 4,520,041 A * 5/1985 Aoyama ............. H01L 21/7684
257/641
5,998,230 A * 12/1999 Gee-Sung ......... G02F 1/136227
257/59
(Continued)

FOREIGN PATENT DOCUMENTS

CN 1743927 A 3/2006

*Primary Examiner* — Peter DungBa Vo
*Assistant Examiner* — Jeffrey Carley
(74) *Attorney, Agent, or Firm* — Andrew C. Cheng

(57) ABSTRACT

A method for manufacturing an array substrate includes a step of forming a first metal layer on a glass substrate such that the first metal layer includes multiple first metal lines distributed as a fan shape, each of the first metal lines including a predetermined number of first metal strip portions that are spaced from each other and have an equal length; forming an insulation layer on the multiple first metal lines in such a way that portions of the insulation layer respectively covering the first metal strip portions are each provided with a first through hole and a second through hole formed therein; and forming a second metal layer on the insulation layer such that the second metal layer includes multiple second metal strip portions respectively in contact with the first metal strip portions of the first metal lines via the first through holes and the second through holes.

20 Claims, 3 Drawing Sheets

(51) Int. Cl.
  *H01L 27/12*    (2006.01)
  *H05K 1/02*     (2006.01)
  *H05K 3/06*     (2006.01)
  *H05K 3/22*     (2006.01)
  *H05K 3/40*     (2006.01)
  *G02F 1/1362*   (2006.01)

(52) U.S. Cl.
  CPC ............ *H05K 1/0213* (2013.01); *H05K 3/06* (2013.01); *H05K 3/22* (2013.01); *H05K 3/4038* (2013.01); *G02F 2001/13629* (2013.01); *H05K 2201/0338* (2013.01); *H05K 2201/0784* (2013.01)

(56) References Cited

U.S. PATENT DOCUMENTS

| | | | | |
|---|---|---|---|---|
| 6,016,174 | A * | 1/2000 | Endo | ............... G02F 1/1368 257/59 |
| 6,686,651 | B1 | 2/2004 | Foster | |
| 8,659,729 | B2 * | 2/2014 | Kim | ............... G02F 1/1393 349/129 |
| 2003/0202151 | A1 * | 10/2003 | Hinata | ............ G02F 1/133555 349/149 |
| 2007/0039706 | A1 * | 2/2007 | Chen | ............... G02F 1/1345 162/301 |
| 2007/0052895 | A1 * | 3/2007 | Chen | ............... G02F 1/1345 349/139 |
| 2007/0003970 | A1 | 7/2007 | Liao | |
| 2008/0013701 | A1 | 1/2008 | Barhydt | |
| 2008/0137016 | A1 * | 6/2008 | Kim | ............. G02F 1/13452 349/139 |
| 2009/0102773 | A1 * | 4/2009 | Um | ............ G02F 1/136213 345/92 |
| 2015/0262536 | A1 * | 9/2015 | Chen | ................ G09G 3/36 345/92 |

\* cited by examiner

B-B'

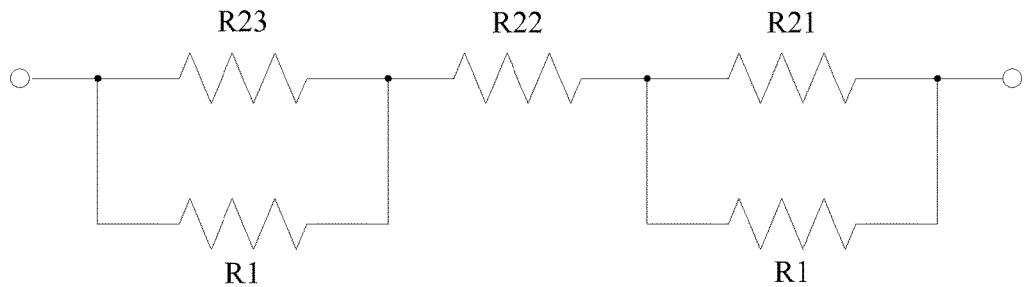

FIG. 5

| forming a first metal layer on a glass substrate and manufacturing the first metal layer into multiple first metal lines distributed as a fan shape, wherein each of the first metal lines includes a first metal strip portion having a predetermined number, and each of the first metal strip portion is spaced apart; lengths of the first metal strip portions of the multiple first metal lines are increased along a direction which is from a center to an edge of the fan shape and the predetermined numbers are decreased along the direction. | ～S31 |

| forming an insulation layer on the multiple first metal lines and providing with a first through hole and a second through hole at a location of the insulation layer covering on each of the first metal strip portion. | ～S32 |

| forming a second metal layer on the insulation layer and manufacturing the second metal layer into multiple second metal strip portions, wherein each of the second metal strip portions contacts with each of the first metal strip portion by the first through hole and the second through hole; a length of the second metal strip portion is greater than or equal to a length of the first metal strip portion. | ～S33 |

FIG. 6

MANUFACTURING METHOD FOR SUBSTRATE OF FLAT PANEL DISPLAY DEVICE

CROSS REFERENCE TO RELATED APPLICATIONS

This is a divisional application of co-pending patent application Ser. No. 13/985,285, "Array Substrate, Manufacturing Method Thereof, and Flat Panel Display Device", filed on Aug. 13, 2013.

BACKGROUND OF THE INVENTION

1. Field of the Invention

The present invention relates to the field of flat panel display technology, in particular to an array substrate, a manufacturing method thereof, and a flat panel display device.

2. Description of Related Arts

People have increasing demand for display devices so that flat panel display can be widely popular, and the LCD (Liquid Crystal Display) and the OLED (Organic Light-Emitting Diode) industries are rapidly developing.

The array substrate is an important element of the display panel, which has an effective display region (referred to AA region, Active Region) and a non-effective display region surrounded the effective display region, the effective display region includes signal lines, scan lines and data lines. The non-effective region includes fan-out leads distributed as a fan shape. The signal lines connect correspondingly to the fan-out leads, and connect to the periphery chip through the fan-out leads. Since the length of each fan-out lead is not equal, if the width of each fan-out leads case is equal, the impedances of the fan-out leads at the central portion of the fan shape are lower than the impedances of the fan-out leads at the edge portion of the fan shape. Therefore, when sending a signal to the signal lines, the signal outputted by the chip cannot keep synchronization so as to cause the display unevenness.

Please refer to FIG. 1 and FIG. 2 together. FIG. 1 is a schematic drawing of the fan-out leads in the prior art. In FIG. 1, it only schematically illustrates three fan-out leads. The fan-out lead 11, fan-out lead 12, and fan-out lead 13 are distributed as a fan shape. The fan-out lead 12 is located at the center of the fan shape, and the fan-out leads 11 and 13 are located at the edges of the fan shape. The lengths of the fan-out lead 11 and the fan-out lead 13 are equal. The fan-out lead 12 utilizes a bending winding way to increase the effective length such that its length is consistent with the lengths of the fan-out lead 11 and the fan-out lead 13. FIG. 2 is a cross-sectional view of the fan-out leads 12 shown in FIG. 1 at the A-A' direction.

The fan-out lead 12 is obtained by sequentially stacking a first metal layer 121, an insulation layer 122, a second metal layer 123 and a passivation layer 124 and by using the array process. Since the first metal layer 121 and the second metal layer 123 are insulated from each other, when a signal is input, the first metal layer 121 and the second metal layer 123 are equivalent to two resistors connected in parallel. The fan-out lead 11 and the fan-out lead 13 have the same internal structures with the fan-out lead 12.

Because each of the fan-out leads has the same structure, and their lengths are also the same, the fan-out lead 11, the fan-out leads 12 and the fan-out lead 13 have equal impedance. However, because the limitation of the conventional art and process, the winding portion of the fan-out lead 12 is relatively sparse such that the height of the fan-out lead 12 is increased, and the area occupied by the non-effective display region is increased. Therefore, it is not conducive for the narrow frame design of the display panel, and reduces the utilization rate of the array substrate.

SUMMARY OF THE INVENTION

The main object of the present invention is to provide an array substrate and a manufacturing method thereof, and a flat panel display device, so as to keep impendences of fan-out leads consistent under the condition that the lengths of the fan-out leads are not equal.

In order to solve the above technical problems, a technical solution provided by the present invention is: an array substrate comprising an effective display region; a non-effective display region surrounding the effective display region; and multiple fan-out leads distributed as a fan shape, wherein each fan-out lead has a predetermined length and the predetermined lengths of the multiple fan-out leads are increased in a given direction from a center to an edge of the fan shape; wherein each of the fan-out leads comprises: first metal strip portions that are of a predetermined number and located on a glass substrate, wherein the first metal strip portions having the predetermined number are disposed in an extension direction of the fan-out lead and are spaced from each other, and a length of each of the first metal strip portions is less than or equal to the predetermined length; an insulation layer covering each of the first metal strip portions, and a location of the insulation layer that cover each of the first metal strip portions is provided with a first through hole and a second through hole formed therein; and a second metal strip portion located on the insulation layer and in contact with each of the first metal strip portions via the first through hole and the second through hole, wherein a length of the second metal strip portion is equal to the predetermined length; and wherein the lengths of the first metal strip portions of the fan-out leads are gradually increased in the direction from the center to the edge of the fan shape and the predetermined numbers of the first metal strip portions are gradually decreased in the direction such that impedances of the fan-out leads are consistent.

In the above array substrate, each of the fan-out leads comprises a passivation layer covering the second metal strip portion.

In the above array substrate, the length of each of the first metal strip portions is equal.

In the above array substrate, a distance between adjacent ones of the first metal strip portions is equal.

In the above array substrate, a line width of each of the fan-out leads is equal.

In order to solve the above technical problems, another technical solution provided by the present invention is: a manufacturing method for an array substrate comprising: forming a first metal layer on a glass substrate such that the first metal layer is formed to comprise multiple first metal lines distributed as a fan shape, wherein each of the first metal lines includes a predetermined number of first metal strip portions that are spaced from each other and have an equal length; and lengths of the first metal strip portions of the multiple first metal lines are increased in a direction from a center to an edge of the fan shape and the predetermined numbers are decreased in the direction; forming an insulation layer on the multiple first metal lines in such a way that portions of the insulation layer respectively covering the first metal strip portions are each provided with a first through hole and a second through hole formed therein; and forming a second metal layer on the insulation layer such that the second metal layer is formed to comprise multiple second metal strip portions, wherein each of the second metal strip portions is in contact with the first metal strip portions of each of the first metal lines via the first through holes and the second through holes and the second metal strip portion has a length that is greater than or equal to the length of the first metal strip portions of the first metal line.

The above manufacturing method further comprises: forming a passivation layer on the multiple second metal strip portions.

In the above manufacturing method, the length of each of the first metal strip portions of each specific one of the metal lines is equal.

In the above manufacturing method, a distance between adjacent ones of the first metal strip portions is equal.

In order to solve the above technical problems, another technical solution provided by the present invention is: a flat panel display device comprising an array substrate, wherein the array substrate comprises: an effective display region; a non-effective display region surrounding the effective display region; and multiple fan-out leads distributed as a fan shape, wherein each fan-out lead has a predetermined length and the predetermined lengths of the multiple fan-out leads are increased in a given direction from a center to an edge of the fan shape; wherein each of the fan-out leads comprises: first metal strip portions that are of a predetermined number and located on a glass substrate, wherein the first metal strip portions having the predetermined number are disposed in an extension direction of the fan-out lead and are spaced from each other, and a length of each of the first metal strip portions is less than or equal to the predetermined length; an insulation layer covering each of the first metal strip portions, and a location of the insulation layer that cover each of the first metal strip portions is provided with a first through hole and a second through hole formed therein; and a second metal strip portion located on the insulation layer and in contact with each of the first metal strip portions via the first through hole and the second through hole, wherein a length of the second metal strip portion is equal to the predetermined length; and wherein the lengths of the first metal strip portions of the fan-out leads are gradually increased in the direction from the center to the edge of the fan shape and the predetermined numbers of the first metal strip portions are gradually decreased in the direction such that impedances of the fan-out leads are consistent.

In the above flat panel display device, each of the fan-out leads comprises a passivation layer covering the second metal strip portion.

In the above flat panel display device, the length of each of the first metal strip portion is equal.

In the above flat panel display device, a distance between adjacent ones of the first metal strip portions is equal.

In the above flat panel display device, a line width of each of the fan-out leads is equal.

In summary, the array substrate, the manufacturing method for the array substrate, and the flat panel display device of the present invention provide a first through hole and a second through hole in each of portions of the insulation layer that respectively cover the first metal strip portions such that the second metal strip portion is in contact with each of first metal strip portions via the first through hole and the second through hole. By adjusting the length of the first metal strip portions of each fan-out lead, the impendences of the fan-out leads can be made consistent under the condition that the lengths of the fan-out leads are not equal so as to decrease the heights of the fan-out leads, increase the utilization of the array substrate, and be beneficial for a narrow frame design of a display panel.

BRIEF DESCRIPTION OF THE DRAWINGS

FIG. 5 is a schematic view showing an equivalent circuit of the fan-out leads shown in FIG. 4; and FIG. 6 is a flowchart illustrating a manufacturing method for an array substrate according to the present invention.

DETAILED DESCRIPTION OF THE PREFERRED EMBODIMENT

The following content combines with the drawings and the embodiment for describing the present invention in detail. It is obvious that the following embodiments are only some embodiments of the present invention. For the skilled persons of ordinary skill in the art without creative effort, the other embodiments obtained thereby are still covered by the present invention.

Figure 3:
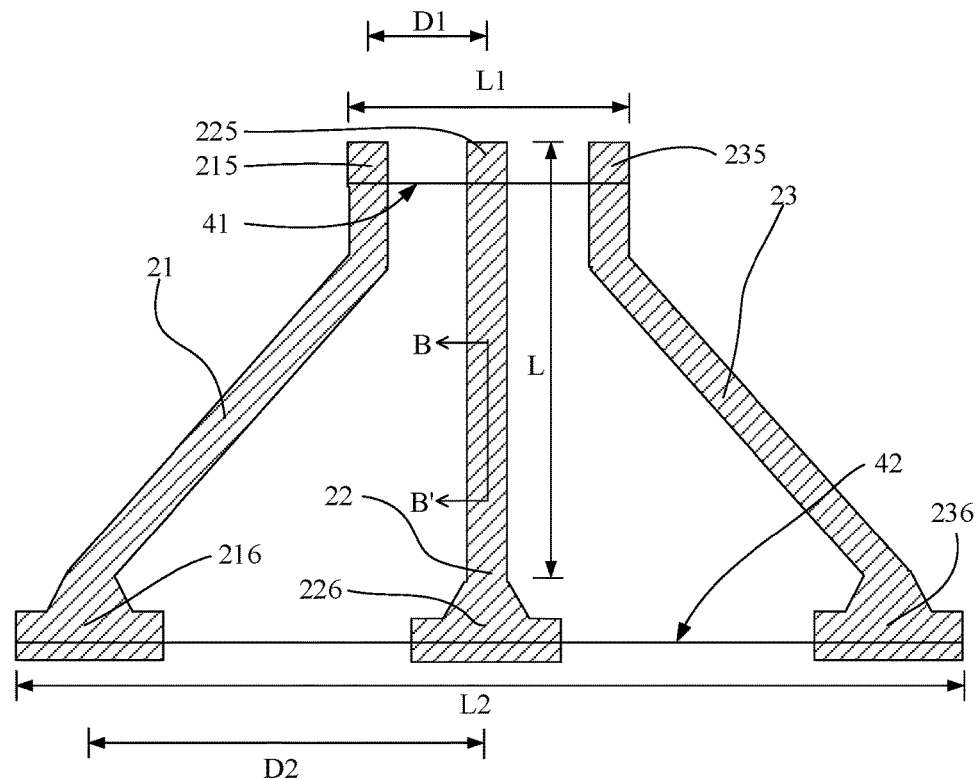
FIG. 3 is schematic view of fan-out leads in a non-effective region of an array substrate according to an embodiment of the present invention.

With reference to FIG. 3, it is a schematic view of fan-out leads in a non-effective region of an array substrate according to an embodiment of the present invention.

The array substrate comprises an effective display region and the non-effective display region. The non-effective display region surrounds the effective display region. The effective display region includes signal lines, and the non-effective display region includes multiple fan-out leads distributed as a fan shape. As shown in FIG. 3, these multiple fan-out leads 21, 22 and 23 are arranged separately from each other, and a distance between second ends of each two adjacent fan-out leads is greater than a distance between first ends of said each two adjacent fan-out leads (e.g., the distance D2 between second ends 216 and 226 of two adjacent fan-out leads 21 and 22 is greater than the distance D1 between first ends 215 and 225 of the two adjacent fan-out leads 21 and 22). Further, first ends 215, 225 and 235 of these multiple fan-out leads 21, 22 and 23 may be arranged along a first straight line 41, second ends 216, 226 and 236 of these multiple fan-out leads 21, 22 and 23 may be arranged along a second straight line 42, a length L2 of the second straight line 42 is longer than a length L1 of the first straight line 41. In addition, the first ends 215, 225 and 235 of the multiple fan-out leads 21, 22 and 23 may be evenly distributed, and the second ends 216, 226 and 236 of the multiple fan-out leads 21, 22 and 23 may be evenly distributed. The signal lines correspondingly connect to the fan-out leads for receiving an external input signal. Each fan-out lead has a predetermined length, and the predetermined lengths of the multiple fan-out leads are gradually increased in a direction from a center to an edge of the fan shape. In this embodiment, a line width of each fan-out lead is equal. It should be understood that it only schematically illustrates three fan-out leads 21, 22 and 23, but it is not used for limiting the number of the fan-out leads. The fan-out lead 22 is located at the center of the fan shape and is the innermost fan-out lead. The fan-out leads 21, 23 are located at the edges of the fan shape and are the outermost fan-out leads.

In the three fan-out leads 21, 22 and 23, each of them has a predetermined length. The predetermined length L of the fan-out lead 22 is less than the predetermined lengths of the fan-out lead 21 and the fan-out lead 23. Please also refer to FIG. 4, and it is a cross-sectional view taken in B-B' direction shown in FIG. 3. The fan-out lead 22 includes first metal strip portions 221, an insulation layer 222 and a second metal strip portion 221.

The first metal strip portions 221 have a predetermined number and are located on a glass substrate 20. The first metal strip portions 221 having the predetermined number are disposed in an extension direction of the fan-out lead 22 and are spaced apart. A length d of each first metal strip portion 221 is less than or equal to the predetermined length L. Because the predetermined length L of the fan-out lead 22 sets up a limitation, when the length d of the first metal strip portion 221 is closer to the predetermined length L, the predetermined number is smaller. It can be understood that if the length d of the first metal strip portion 221 is equal to the predetermined length L, the predetermined number of the first metal strip portion 221 is one. In this embodiment, the length d of each of the first metal strip portions 221 is equal. Furthermore, a distance between adjacent ones of the first metal strip portion 221 is equal.

The insulation layer 222 covers each of the first metal strip portions 221. Portions of the insulation layer 222 that respectively cover the first metal strip portions 221 are each provided with a first through hole 2221 and a second through hole 2222 formed therein. Between every two first metal strip portions 221, the insulation layer 222 also covers the glass substrate 20.

A second metal strip portion 223 is located on the insulation layer 222. The second metal strip portion 223 contacts with each of the first metal strip portions 221 via the first through hole 2221 and the second through hole 2222. A length of the second metal strip portion 223 is equal to the predetermined length L.

The internal structures of the fan-out lead 21 and the fan-out leads 21 and 23 are the same. The difference is that a length of the first metal strip portions of the fan-out lead 21 and the fan-out lead 23 is longer than the length d of the first metal strip portions 221 of the fan-out lead 22. The fan-out lead 21, the fan-out lead 22, and the fan-out lead 23 use the insulation layer 222 commonly. For the number of the fan-out leads that is more than three, the lengths of the first metal strip portions of the fan-out leads are gradually increased in a direction from a center to an edge of the fan shape and the predetermined numbers are gradually decreased in the direction such that at impedance of each fan-out lead is consistent.

In another embodiment, the fan-out leads 22 each include a passivation layer 224. The passivation layer 224 covers the second metal strip portion 223 so as to enhance abrasion and corrosion resistance for the second metal strip portion.

Figure 1:
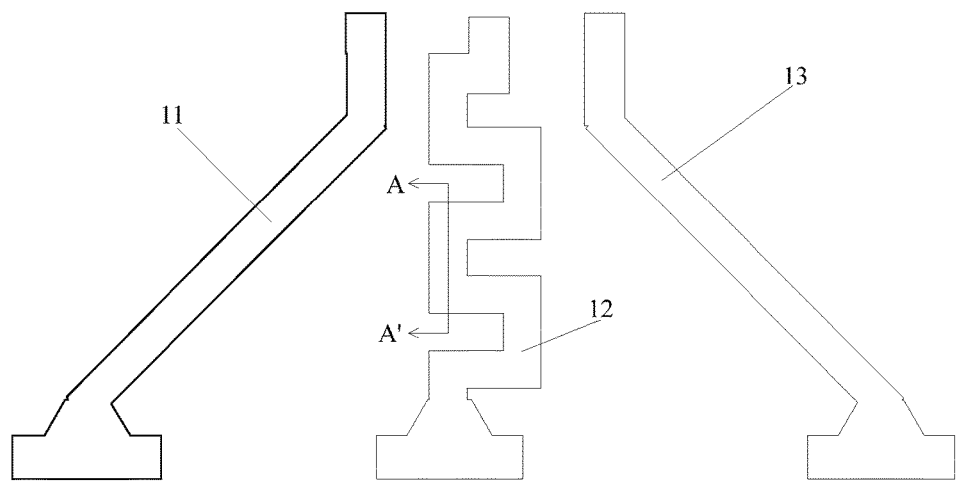
FIG. 1 is a schematic drawing of the fan-out leads in the prior art.
Figure 2:
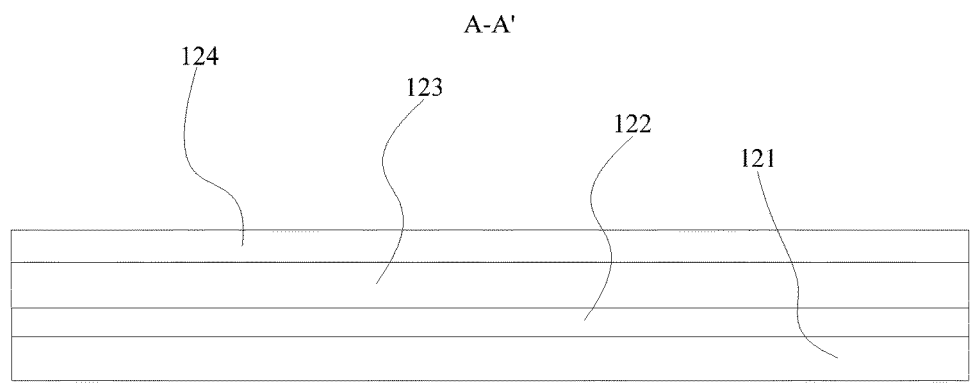
FIG. 2 is a cross-sectional view, taken in A-A' direction, of the fan-out lead 12 shown in FIG. 1.

Please refer to FIG. 2 and FIG. 5. FIG. 5 is a schematic view showing an equivalent circuit of the fan-out leads shown in FIG. 4. There are two first metal strip portions 221 in FIG. 4, and the two portions 221 correspond to two impedances R1 in FIG. 5. Each of first metal strip portions 221 contacts with the second the metal strip portion 223 via the first through hole 2221 and the second through hole 2222. That is equivalent to the first metal strip portion 221 connecting to a portion of the second metal strip portion 223 in parallel and this corresponds to that the impedance R1 connects to an impedance R21 and an impedance R23 in parallel in FIG. 5. Because the second the metal strip portion 223 is not in completely contact with the first metal strip portion 221, a portion of the second the metal strip portion 223 which is not in contact with the first metal strip portion 221 is equivalent to an impedance R22 in FIG. 5. That is, the impedance R21, the impedance R22, and the impedance R23 collectively define the impedance of the second metal strip portion 223.

Here, it compares an equivalent circuit of the fan-out lead 22 and an equivalent circuit of the fan-out lead 12 in FIG. 2. It assumes that the upper and lower metal layers of the fan-out lead 12 in the prior art are respectively of an impedance R1' and R2'. The equivalent circuit is that the impedance R1' is parallel to R2'. It can be known that R1' is greater than R1.

Figure 4:
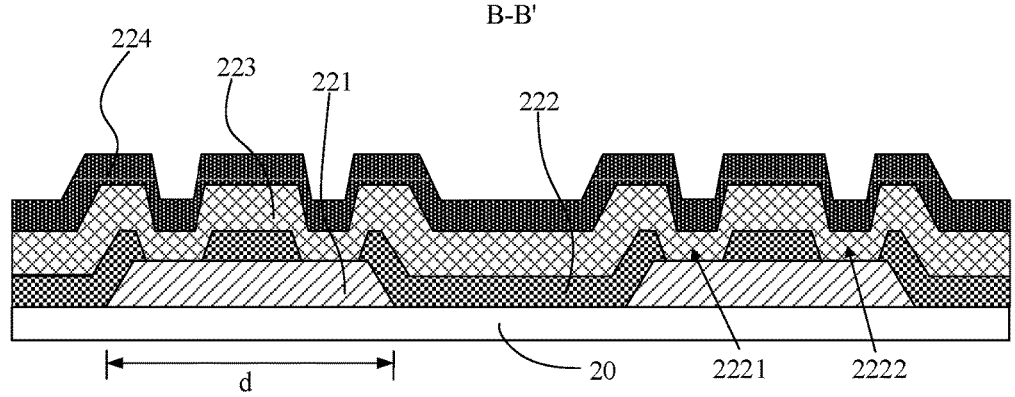
FIG. 4 is a cross-sectional view taken in B-B' direction of FIG. 3.

In FIG. 4, because the length of the second metal strip 223 of the fan-out lead 22 is equal to the predetermined length L, the impedance R2 is very close to the impedance R2' such that it can assume R2=R2'=R21+R2+R23.

In FIG. 2, the equivalent impedance of the fan-out lead 12 is:

$$R_o'=(R1'*R2')/(R1'+R2')=R2'/(1+R2'/R1')$$

Under the condition of equal length, a thickness of the second metal layer 123 is smaller than a thickness of the first metal layer 121 so that according to the impedance formula, $R=\rho l/S$, $R2' \geq R1'$, then $R_0 \leq R2/2$.

The equivalent impedance of the fan-out lead 22 in FIG. 5 is:

$$R_o=(R1*R21)/(R1+R21)+R22+(R1*R23)/(R1+R23)$$
$$=R21/(1+R21/R1)+R22+R23/(1+R23/R1).$$

If it adjusts the length d of the first metal strip portions 221 to be smaller than a certain value, the impedance R22 can be larger than R2/2 such that $R_o$ can be larger than R2/2, that is, $R_o \geq R_0'$.

Therefore, under the condition of equal length, after adjusting the length d of the first metal strip portions 221, the impedance of the fan-out lead 22 is consistent with the impedance of the fan-out lead 12.

In addition, if the length d of the first metal strip portions 221 of the fan-out lead 22 is increased, the length of the second metal strip portion 223 which does not contact the first metal strip portion 221 is reduced. That will cause the impedance R22 to be decreased so as to reduce the $R_o$. It also means that although the predetermined length of the fan-out leads 21 and 23 is greater than the predetermined length L of the fan-out lead 22, it can decrease the impedance of the fan-out leads 21 or 23 by increasing the length of the first metal strip portions of the fan-out leads 21, 23 in order to keep their impedances consistent with the impedance of the fan-out lead 22.

The array substrate of the embodiment of the present invention can keep the consistency of the impedance in the case of unequal length of the fan-out leads by adjusting the length of the first metal strip portions of the fan-out leads. By the above way, it does not require to perform winding process for the fan-out leads so as to decrease the height of the fan-out leads, increase the utilization of the array substrate, and be beneficial for the narrow frame design of the display panel.

The present invention also provides a flat panel display device, and the flat panel display device includes an array substrate described with reference to the above embodiments. Other parts of the flat panel display device can refer to the prior art, and it is not described in detail here.

With reference to FIG. 6, it is a flowchart of a manufacturing method for an array substrate according to the present invention. The manufacturing method comprises the following steps:

Step S31: forming a first metal layer on a glass substrate such that the first metal layer is formed to comprise multiple first metal lines distributed as a fan shape, wherein each of the first metal lines includes a predetermined number of first metal strip portions that are spaced from each other; and lengths of the first metal strip portions of the multiple first metal lines are increased in a direction from a center to an edge of the fan shape and the predetermined numbers are decreased in the direction.

The first metal layer may be formed through a deposition process. After the first metal layer is formed, the first metal layer is subjected to wet etching to form the multiple first metal lines distributed as a fan shape. Because each of the first metal lines comprises a predetermined number of first metal strip portions that are spaced from each other so that each of the first metal lines is not a continuous line. The predetermined number of the first metal strip portions of each first metal line is different. If the length of the first metal strip portion is longer, the predetermined number is smaller.

In this embodiment, for each specific one of the first metal lines, the length of each first metal strip portion is equal and a distance between adjacent ones of the first metal strip portions is equal.

Step S32: forming an insulation layer on the multiple first metal lines in such a way that portions of the insulation layer respectively covering the first metal strip portions are each provided with a first through hole and a second through hole formed therein.

The insulation layer is formed through a coating process. After the formation of the insulation layer, a dry etching process is applied to form the first through hole and the second through hole in the insulation layer.

Step S33: forming a second metal layer on the insulation layer such that the second metal layer is formed to comprise multiple second metal strip portions, wherein each of the second metal strip portions is in contact with the first metal strip portions of each of the first metal lines via the first through holes and the second through holes and the second metal strip portion has a length that is greater than or equal to the length of the first metal strip portions of the first metal line.

The second metal layer may also be formed through a deposition process. After the second metal layer is formed, the second metal layer is subjected to a wet etching process to form the multiple second metal strip portions. A line width of the second metal strip portions is equal to a line width of the insulation layer.

The length of the second metal strip portion is the length of the fan-out lead. The length of the first metal strip portions can equal to the length of the second metal strip portion, and the predetermined number of the first metal strip portions is one in this condition. Correspondingly, the first and second through holes are respectively one in number under this condition. That condition is equivalent to that the first metal strip portion and the second metal strip portion are connected in parallel.

After step S33, the manufacturing method may further include: forming a passivation layer on the multiple second metal strip portions. The passivation layer can protect the second metal strip portions.

Through the above way, the array substrate, the manufacturing method for the array substrate, and the flat panel display device of the present invention provide a first through hole and a second through hole in each of portions of the insulation layer that respectively cover the first metal strip portions such that the second metal strip portions are each in contact with the first metal strip portions of a first metal line via the first through hole and the second through hole. By adjusting the length of the first metal strip portion of each fan-out lead, it can keep impendences of the fan-out leads to be consistent under the condition that the lengths of the fan-out leads are not equal so as to decrease the heights of the fan-out leads, increase the utilization of the array substrate, and be beneficial for the narrow frame design of the display panel.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A method for manufacturing a glass substrate of a flat panel display device, the substrate comprising multiple fan-out leads, wherein the multiple fan-out leads are arranged separately from each other, and a distance between second ends of two adjacent fan-out leads is greater than a distance between first ends of said two adjacent fan-out leads, the method comprising the following steps:
    forming a first metal layer on the glass substrate and forming the first metal layer to comprise multiple first metal lines, wherein each of the first metal lines includes a plurality of first metal strip portions that are spaced from each other and have the same length; and lengths of the first metal strip portions of the multiple first metal lines are increased in a direction from an innermost first metal line of the multiple first metal lines to an outermost first metal line of the multiple first metal lines and numbers of the first metal strip portions of the multiple first metal lines are decreased in the direction;
    forming an insulation layer on the multiple first metal lines in such a way that portions of the insulation layer respectively covering the first metal strip portions are each provided with a first through hole and a second through hole formed therein; and
    forming a second metal layer on the insulation layer and forming the second metal layer to comprise multiple second metal strip portions, wherein each of the second metal strip portions is in contact with each of the first metal strip portions of each of the first metal lines via the first through hole and the second through hole and each of the second metal strip portions has a length that is greater than or equal to the length of the first metal strip portions being contacted;
    wherein each of the multiple fan-out leads comprises one of the first metal lines, the insulation layer on said one of the first metal lines, and one of the multiple second metal strip portions that is in contact with said one of the first metal lines.

2. The method as claimed in claim 1 further comprising a step of forming a passivation layer on the multiple second metal strip portions.

3. The method as claimed in claim 1, wherein the plurality of first metal strip portions of each of the first metal lines are equally spaced from each other.

4. The method as claimed in claim 1, wherein the first metal layer is formed on the glass substrate through a deposition process.

5. The method as claimed in claim 4, wherein the first metal layer formed on the glass substrate is subjected to wet etching to form the multiple first metal lines.

6. The method as claimed in claim 1, wherein the insulation layer is formed through a coating process.

7. The method as claimed in claim 6, wherein the first and second through holes are formed in the insulation layer through dry etching.

8. The method as claimed in claim 1, wherein the second metal layer is formed through a deposition process.

9. The method as claimed in claim 8, wherein the second metal layer is subjected to wet etching to form the multiple second metal strip portions.

10. A method for manufacturing a glass substrate of a flat panel display device, the substrate comprising multiple fan-out leads, wherein the multiple fan-out leads are arranged separately from each other, and a distance between second ends of two adjacent fan-out leads is greater than a distance between first ends of said two adjacent fan-out leads, the method comprising the following steps:
forming a first metal layer on the glass substrate and forming the first metal layer to comprise multiple first metal lines, wherein each of the first metal lines includes a plurality of first metal strip portions that are spaced from each other and have the same length, the plurality of first metal strip portions of each of the first metal lines being equally spaced from each other; and lengths of the first metal strip portions of the multiple first metal lines are increased in a direction from an innermost first metal line of the multiple first metal lines to an outermost first metal line of the multiple first metal lines and numbers of the first metal strip portions of the multiple first metal lines are decreased in the direction;
forming an insulation layer on the multiple first metal lines in such a way that portions of the insulation layer respectively covering the first metal strip portions are each provided with a first through hole and a second through hole formed therein; and
forming a second metal layer on the insulation layer and forming the second metal layer to comprise multiple second metal strip portions, wherein each of the second metal strip portions is in contact with each of the first metal strip portions of each of the first metal lines via the first through hole and the second through hole and each of the second metal strip portions has a length that is greater than or equal to the length of the first metal strip portions being contacted;
wherein each of the multiple fan-out leads comprises one of the first metal lines, the insulation layer on said one of the first metal lines, and one of the multiple second metal strip portions that is in contact with said one of the first metal lines.

11. The method as claimed in claim 10 further comprising a step of forming a passivation layer on the multiple second metal strip portions.

12. The method as claimed in claim 10, wherein the first metal layer is formed on the glass substrate through a deposition process.

13. The method as claimed in claim 12, wherein the first metal layer formed on the glass substrate is subjected to wet etching to form the multiple first metal lines.

14. The method as claimed in claim 10, wherein the insulation layer is formed through a coating process.

15. The method as claimed in claim 14, wherein the first and second through holes are formed in the insulation layer through dry etching.

16. The method as claimed in claim 10, wherein the second metal layer is formed through a deposition process.

17. The method as claimed in claim 16, wherein the second metal layer is subjected to wet etching to form the multiple second metal strip portions.

18. A method for manufacturing a glass substrate of a flat panel display device, the substrate comprising multiple fan-out leads, wherein the multiple fan-out leads are arranged separately from each other, and a distance between second ends of two adjacent fan-out leads is greater than a distance between first ends of said two adjacent fan-out leads, the method comprising the following steps:
forming a first metal layer on the glass substrate and forming the first metal layer to comprise multiple first metal lines, wherein each of the first metal lines includes a plurality of first metal strip portions that are spaced from each other and have the same length; and lengths of the first metal strip portions of the multiple first metal lines are increased in a direction from an innermost first metal line of the multiple first metal lines to an outermost first metal line of the multiple first metal lines and numbers of the first metal strip portions of the multiple first metal lines are decreased in the direction;
forming an insulation layer on the multiple first metal lines in such a way that portions of the insulation layer respectively covering the first metal strip portions are each provided with a first through hole and a second through hole formed therein;
forming a second metal layer on the insulation layer and forming the second metal layer to comprise multiple second metal strip portions, wherein each of the second metal strip portions is in contact with each of the first metal strip portions of each of the first metal lines via the first through hole and the second through hole and each of the second metal strip portions has a length that is greater than or equal to the length of the first metal strip portions being contacted; and
forming a passivation layer on the multiple second metal strip portions;
wherein each of the multiple fan-out leads comprises one of the first metal lines, the insulation layer on said one of the first metal lines, and one of the multiple second metal strip portions that is in contact with said one of the first metal lines.

19. The method as claimed in claim 1, wherein the first ends of the multiple fan-out leads are arranged along a first straight line, and the second ends of the multiple fan-out leads are arranged along a second straight line.

20. The method as claimed in claim 19, wherein the first ends of the multiple fan-out leads are evenly distributed, and the second ends of the multiple fan-out leads are evenly distributed.

* * * * *